US009551747B2

(12) United States Patent
Douskey et al.

(10) Patent No.: US 9,551,747 B2
(45) Date of Patent: *Jan. 24, 2017

(54) INSERTING BYPASS STRUCTURES AT TAP POINTS TO REDUCE LATCH DEPENDENCY DURING SCAN TESTING

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 87 days.

This patent is subject to a terminal disclaimer.

(21) Appl. No.: 14/568,312

(22) Filed: Dec. 12, 2014

(65) Prior Publication Data

US 2016/0169967 A1    Jun. 16, 2016

(51) Int. Cl.
*G01R 31/28* (2006.01)
*G01R 31/317* (2006.01)
*G01R 31/3185* (2006.01)

(52) U.S. Cl.
CPC ... *G01R 31/3172* (2013.01); *G01R 31/318541* (2013.01); *G01R 31/318544* (2013.01); *G01R 31/318594* (2013.01)

(58) Field of Classification Search
CPC .................. G01R 31/3177; G01R 31/31723
See application file for complete search history.

(56) References Cited

U.S. PATENT DOCUMENTS

| 5,544,173 | A | 8/1996 | Meltzer |
| 5,909,453 | A | 6/1999 | Kelem et al. |
| 6,618,828 | B1 | 9/2003 | Armstrong |
| 7,441,171 | B2 | 10/2008 | Iyengar |
| 7,752,514 | B2 | 7/2010 | Huisman et al. |
| 7,930,607 | B2 | 4/2011 | Sinanoglu |
| 8,103,926 | B2 | 1/2012 | Gizdarski |
| 2008/0127021 | A1* | 5/2008 | Goel ............... G06F 17/5045 716/122 |
| 2008/0255780 | A1* | 10/2008 | Waayers ........ G01R 31/318536 702/58 |

(Continued)

OTHER PUBLICATIONS

"LSSD Scan Design Enhancement for Logic Diagnostics," IPCOM000017002D, IBM, Jul. 22, 2003, 3 pages.

(Continued)

*Primary Examiner* — April Y Blair
*Assistant Examiner* — Thien D Nguyen

(57) ABSTRACT

A method and apparatus are provided to test an integrated circuit by identifying first and second components of an integrated circuit. The first and second components may share a relationship that causes the first and second components to generate a matching binary output in response to an input to the integrated circuit. A tap point may be selected within the integrated circuit. The tap point may be located at a point in the integrated circuit where an insertion of a bypass structure would affect the relationship. The bypass structure may be inserted at the tap point, and the bypass structure may be used to conduct a test of the integrated circuit.

20 Claims, 6 Drawing Sheets

(56) References Cited

U.S. PATENT DOCUMENTS

| | | | |
|---|---|---|---|
| 2011/0083195 A1* | 4/2011 | Crouch | G01R 31/318558 726/27 |
| 2011/0231720 A1* | 9/2011 | Zuo | G01R 31/318572 714/729 |
| 2012/0047476 A1* | 2/2012 | Ward | G06F 17/505 716/104 |
| 2013/0297980 A1* | 11/2013 | Chen | G01R 31/3177 714/726 |

OTHER PUBLICATIONS

"XOR-Network for LBIST and LFSR-Coding," IPCOM000010840D, IBM, Jan. 24, 2003, 6 pages.

"List of IBM Patents or Patent Applications Treated as Related", Dec. 17, 2014, 2 pages.

Douskey, et al., "Inserting Bypass Structures at Tap Points to Reduce Latch Dependency During Scan Testing", U.S. Appl. No. 14/574,613, filed Dec. 18, 2014.

List of IBM Patents or Patent Applications Treated as Related, Dec. 17, 2014.

\* cited by examiner

US 9,551,747 B2

INSERTING BYPASS STRUCTURES AT TAP POINTS TO REDUCE LATCH DEPENDENCY DURING SCAN TESTING

I. FIELD OF THE DISCLOSURE

The present disclosure relates generally to the design of circuits of integrated circuits, and more particularly, to testing integrated circuits for fault isolation.

II. BACKGROUND

Scan testing of circuits is accomplished by connecting scan elements (e.g., latches) in series in a test path. The output of each scan element is fed to an input of a next scan element in a scan chain. Faults resulting from manufacturing defects can cause timing related errors in the test path. Faults that reflect interdependencies of scan elements can prevent certain data paths from being executed. The unexecuted paths can prevent failing locations from being detected, diagnosed and corrected. Diagnosing failing locations can lead to fabrication process and design changes to improve later yield and reduce waste.

III. SUMMARY OF THE DISCLOSURE

According to an embodiment, a method of testing of an integrated circuit may include identifying first and second components of an integrated circuit. The first and second components may share a relationship that causes the first and second components to generate a matching binary output in response to an input to the integrated circuit. A tap point may be selected within the integrated circuit. The tap point may be located at a point in the integrated circuit where an insertion of a bypass structure would affect the relationship. The bypass structure may be inserted at the tap point, and the bypass structure may be used to conduct a test of the integrated circuit.

According to another embodiment, an apparatus may include a first component of an integrated circuit and a second component of the integrated circuit. The first and second components may share a relationship that causes the first and second components to generate a matching binary output in response to an input to the integrated circuit. The apparatus may further include a bypass structure and a processor configured to execute program code to identify the first and second components of the integrated circuit. A tap point may be selected within the integrated circuit. The tap point may be located at a point in the integrated circuit where an insertion of the bypass structure would affect the relationship. The bypass structure may be inserted at the tap point.

According to another embodiment, a computer readable storage medium may include instructions that when executed by a processor cause the processor to identify first and second components of an integrated circuit. The first and second components may share a relationship that causes the first and second components to generate a matching binary output in response to an input to the integrated circuit. A tap point may be selected within the integrated circuit. The tap point may be located at a point in the integrated circuit where an insertion of a bypass structure would affect the relationship. The bypass structure may be inserted at the tap point, and the bypass structure may be used to conduct a test of the integrated circuit.

An embodiment of the system may identify and reduce fail data associated with testing an integrated circuit. Embodiments of the system may improve the diagnostic time for isolating a failing latch in a scan chain, and improvements may be made to improve production. An embodiment of the system may inject another, different scan path while leaving an original scan path intact. In this manner, a latch may be affected without affecting other parts of the scan chain. Use of the bypass structures, injection points, and partitioned scan chains may allow detection and analysis of downstream components that might have otherwise been indeterminable.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

FIG. 1 generally illustrates a data processing apparatus configured to detect latch dependencies to facilitate further testing of an integrated circuit;

V. DETAILED DESCRIPTION

Figure 1:
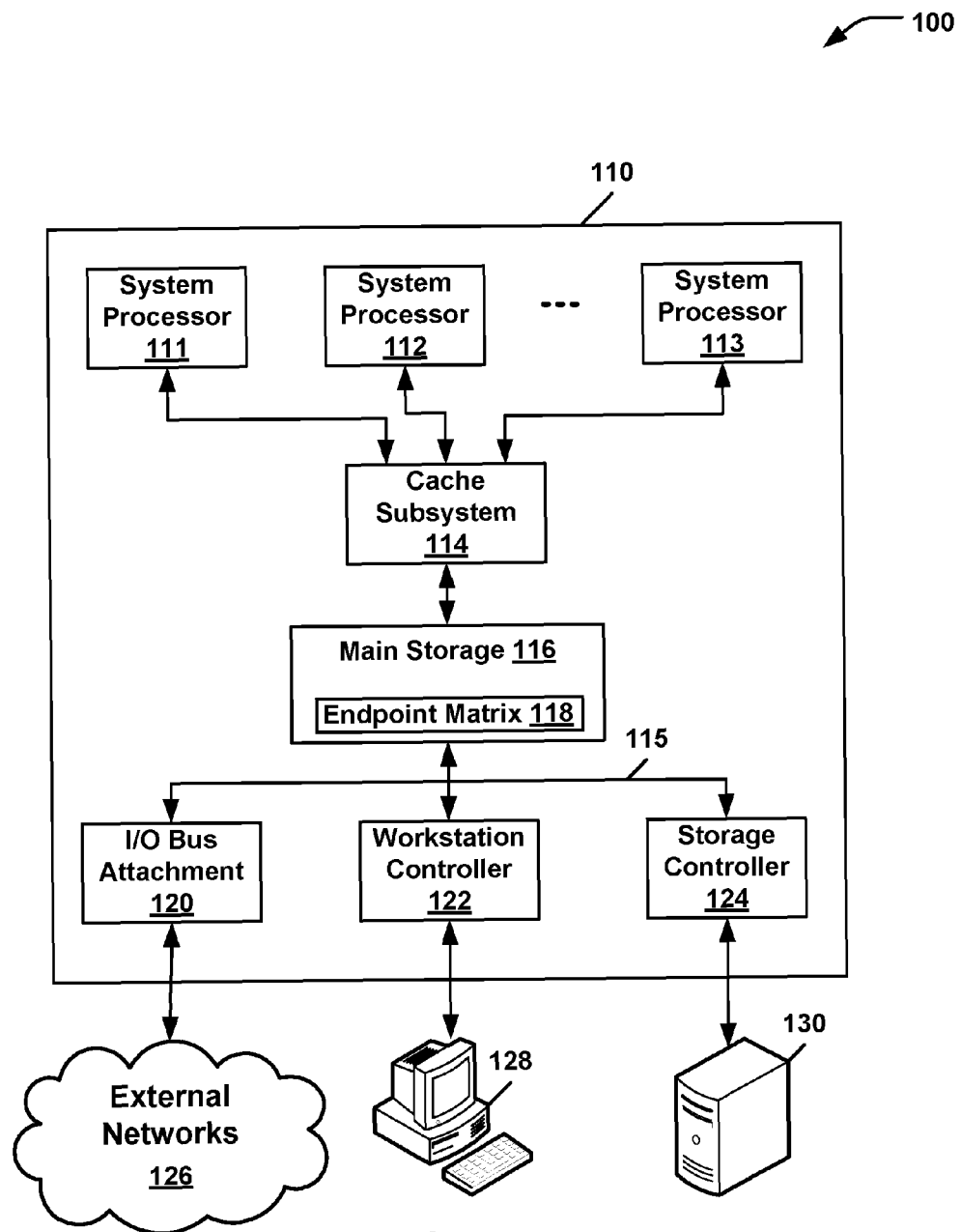

An embodiment of a system may automatically identify problem areas of a circuit and determine how and where to modify a scan path to remove dependencies. An embodiment of a system may logically analyze scan paths to identify circuit configurations where a dependency may cause a functional status of a component to be indeterminable (e.g., because it cannot be tested). The system may increase an amount of a combination logic path that may be tested and may facilitate transition fault testing improvements.

An embodiment of a system may insert a multiplexer into a scan chain at a tap point to enable circuit testing of components exhibiting latch dependency. A valid tap point may comprise a scan position that does not contribute to a same cone of logic. A cone of logic may include combination logic in a circuit that resolves to a single point.

Problematic configurations may include scan latch adjacency and parallel latches fed by a common scan input. Scan latch adjacency may exist when two latches are next to each other in a scan chain and feed common logic. The scan data to achieve a transition on an upstream latch affects a downstream latch. The affect may prohibit certain path faults from being detected. Scan latch adjacency can also exist across scan chains that receive scan data from a common input pin. Parallel latches in common scan chains may mask path faults when the latches feed common logic since the latches are transitioning at the same time. In parallel latch dependency, if latches are a same distance away from the scan in, they may be receiving the same data. So in making a first latch a zero, a zero will be present on a second latch that is the same distance away from the primary input.

Put another way, latch scan dependencies may include adjacent dependencies and parallel path adjacencies. Scan adjacencies may be present when components are next to each other in the same scan chain. In the case of parallel path adjacencies, scan chains may be fed from same primary input and a relative position of the component may result in the parallel components having matching output.

In a manufacturing test process, it is useful to activate, locate and address faults. Rather than reordering components of scan chain, an embodiment of the system may inject another, different scan path while leaving the original scan path intact. In this manner, a latch may be affected without affecting other parts of the scan chain.

According to an embodiment, program code may approach analysis backwards from a latch component to determine what values may be needed to get a desired output for a test. In this manner, a dependency may be recognized. The program code may determine that a component is dependent on an output of component that is to be tested. Data may be pulled from another component that is functionally independent from the component to be tested. That data may be loaded so that it is received earlier. As a consequence, different sets of data may be received at the two components. Logic (i.e., a multiplexer or another bypass structure) may be added along with associated wiring.

In some cases, it is possible to do some analysis and to change the scan path to certain latches to fully test certain parts of the logic. Reordering scan path components can lead to other complications in testing. For instance, fixing one latch dependency by reordering may cause a dependency in another latch. Embodiments of the system may avoid such complications by adding new paths that may not affect components not under test, thus enabling further testing and determinations.

The drawings illustrate examples in which program code may insert bypass structures to further testing of an integrated circuit that could otherwise be obscured by latch scan dependencies. For example, FIG. 1 generally illustrates a data processing apparatus 100 configured to detect and isolate faults in an integrated circuit. The apparatus 100 may generally include a computer, a computer system, a computing device, a server, a disk array, client computing entity, or other programmable device, such as a multi-user computer, a single-user computer, a handheld device, a networked device (including a computer in a cluster configuration), a mobile phone, a video game console (or other gaming system), etc. The apparatus 100 may be referred to as a logically partitioned computing system or computing system, but may be referred to as computer for the sake of brevity. One suitable implementation of the computer 110 may be a multi-user computer.

The computer 110 generally includes one or more physical processors 111, 112, 113 coupled to a memory subsystem including a main storage 116. The main storage 116 may include a flash memory, a hard disk drive, and/or another digital storage medium. As shown in FIG. 1, the main storage 116 may include a common endpoint matrix 118 for use in latch dependency analysis.

The processors 111, 112, 113 may be multithreaded and/or may have multiple cores. A cache subsystem 114 is illustrated as interposed between the processors 111, 112, 113 and the main storage 116. The main storage 116 may include logic, or other program code, configured to determine and isolate faulty components. The cache subsystem 114 typically includes one or more levels of data, instruction and/or combination caches, with certain caches either serving individual processors or multiple processors.

The main storage 116 may be coupled to a number of external input/output (I/O) devices via a system bus 115 and a plurality of interface devices, e.g., an I/O bus attachment interface 120, a workstation controller 122, and/or a storage controller 124 that respectively provide external access to one or more external networks 126, one or more workstations 128, and/or one or more storage devices 130, such as a direct access storage device (DASD). The system bus 115 may also be coupled to a user input (not shown) operable by a user of the computer 110 to enter data (i.e., the user input sources may include a mouse, a keyboard, etc.) and a display (not shown) operable to display data from the computer 110 (i.e., the display may be a CRT monitor, an LCD display panel, etc.), and an optical sensor (not shown). The computer 110 may also be configured as a member of a distributed computing environment and communicate with other members of that distributed computing environment through an external network 126.

Figure 2:
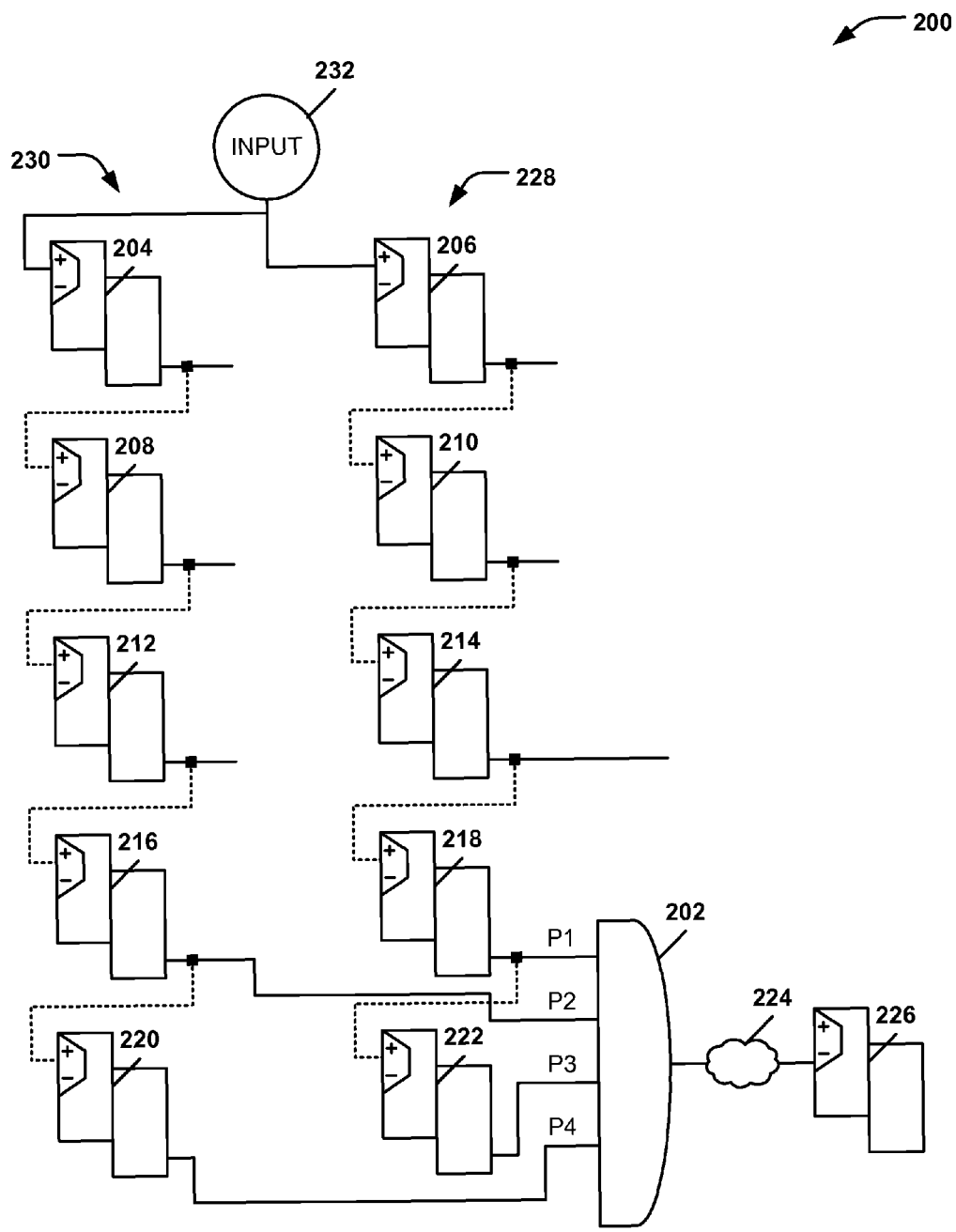
FIG. 2 shows a circuit configuration that includes components of an integrated circuit that includes latch pair dependencies that may impede testing.

FIG. 2 shows a circuit configuration 200 that includes components of an integrated circuit that includes latch pair dependencies that may impede testing. The components include a four input AND gate 202 and latches 204, 206, 208, 210, 212, 214, 216, 218, 220, 222, 226. When testing the four input AND gate 202, logic at pin input P1 may only be tested when all other pin inputs P2, P3, P4 of the four input AND gate 202 are at one. The path from latch 218 through the AND gate 202 and the logic 224 to the latch 226 may only be tested when all of the other pin inputs P2, P3, P4 on the AND gate 202 are at one when the latch 218 transitions to release a timed test pattern.

In the embodiment shown in FIG. 2, the four input AND gate 202 and circuit 200 include both a scan latch adjacency issue and a common scan chain position issue. In an example, a test may focus on a transition fault on P1 from a zero to a one, or from a one to a zero. To achieve meaningful test results, dependencies on the other paths P2-P4 should be removed. Put another way, each of the paths P2-P4 may have a dependency on the scan chain 228, 230 that needs to be resolved to test a transition fault on P1. For instance, a third pin input P3 may have a scan latch adjacency issue, and a second pin input P2 may have a common scan chain adjacency issue. As described herein, adjacency dependencies may result where input from one component in a scan chain directly affects an output of a second component in a scan chain.

Figure 4:
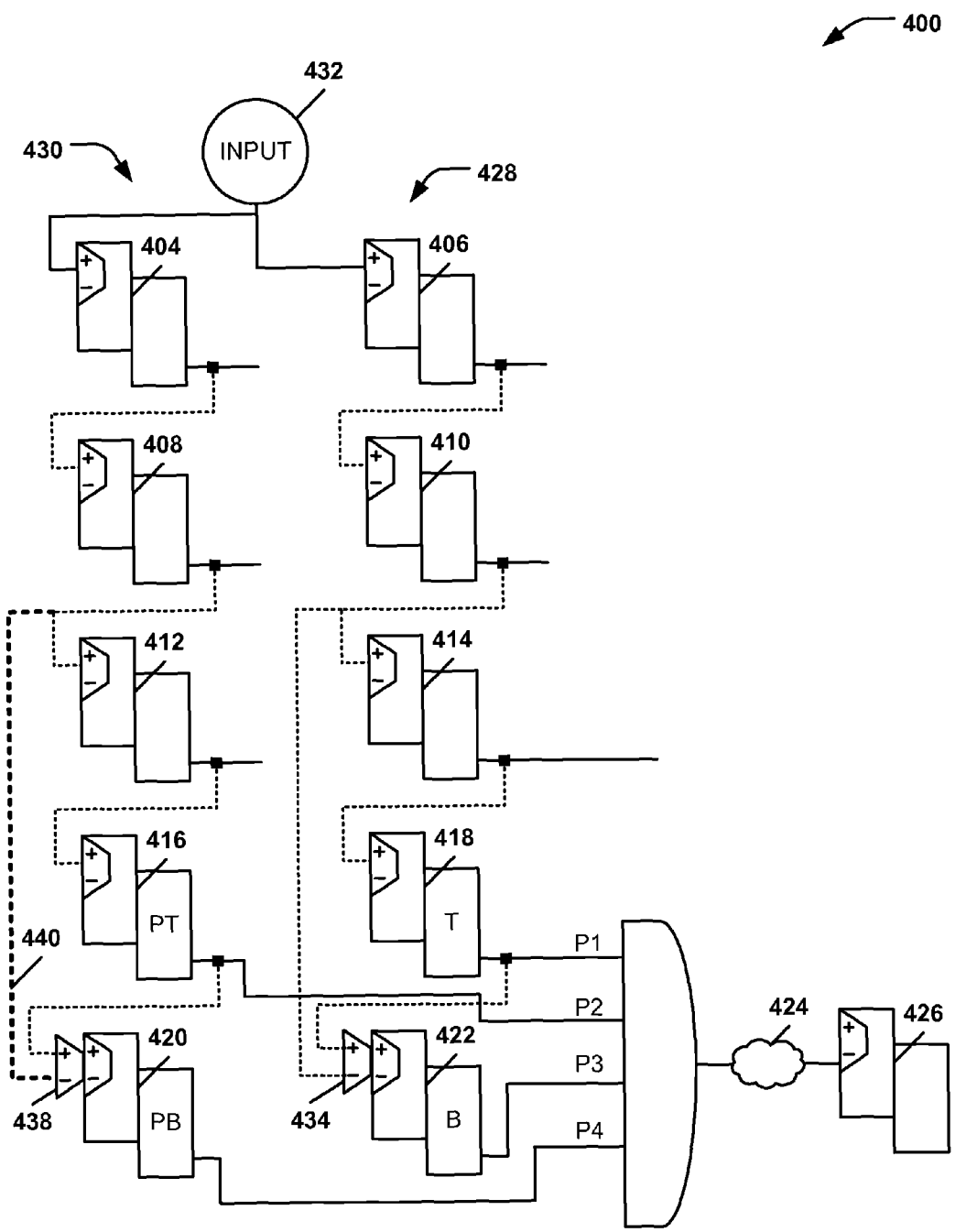
FIG. 4 shows a circuit configuration that includes a multiplexer placed at a tap point to remove scan adjacency present across scan chains of the integrated circuit.
Figure 5:
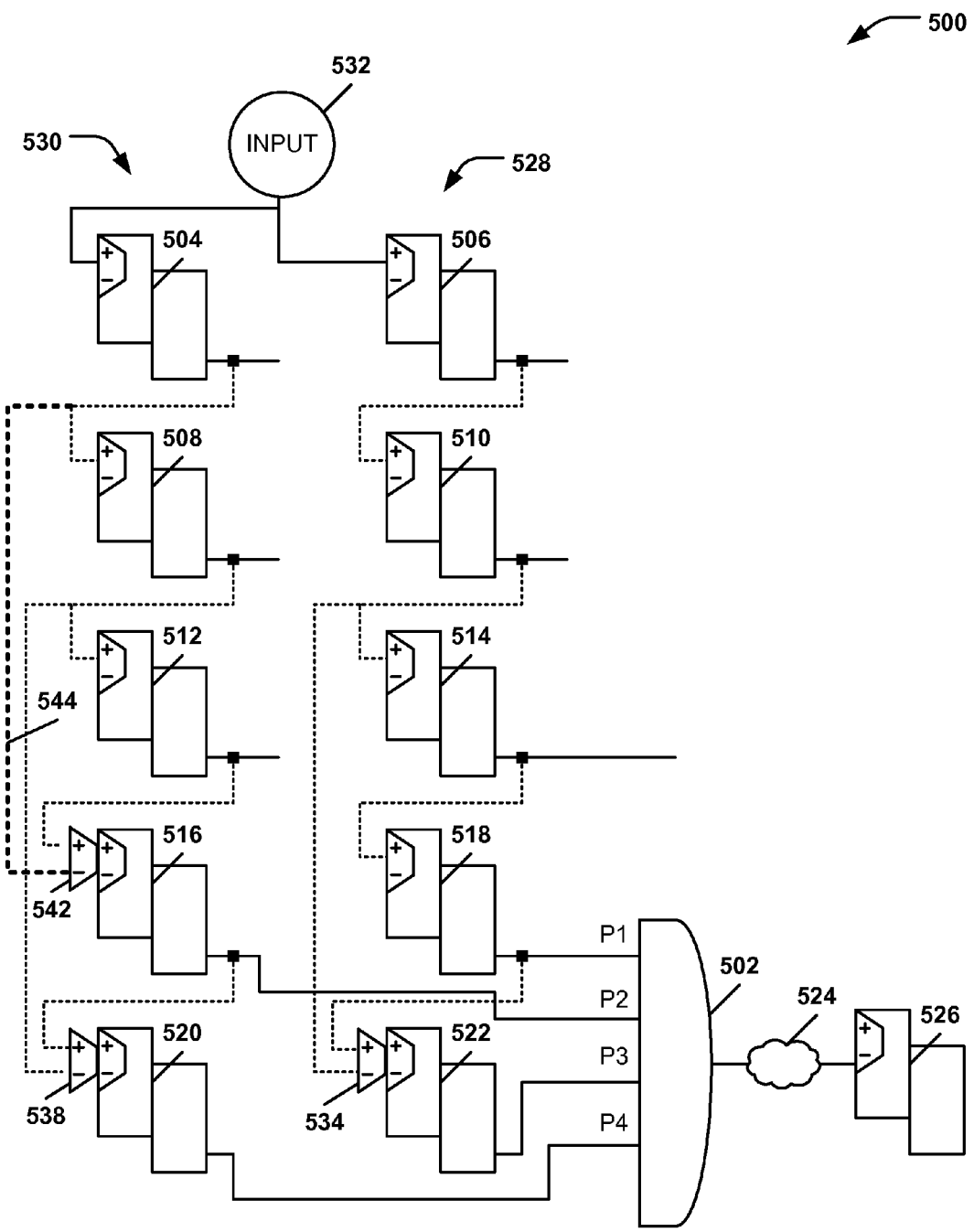
FIG. 5 shows a circuit configuration that includes a multiplexer inserted at a tap point to remove an parallel latch scan dependency.

A fourth pin input P4 may also have a common scan chain position (e.g., parallel dependency) issue. If latches are the same distance away from the circuit input 232, the latches 204, 208, 212, 216, 220 are receiving the same data as the latches 206, 210, 214, 218, 222, respectively, even though they are on different scan chains 228, 230. So in making a first latch a zero, a zero will be present on a second latch that is the same distance away from the primary input. To remove the dependencies (in order to test the transition on P1), paths P2, P3, and P4 may be made to be a stable one value or to transition to a one value. Techniques and systems used to remove such dependencies are shown in FIGS. 3-5.

Figure 3:
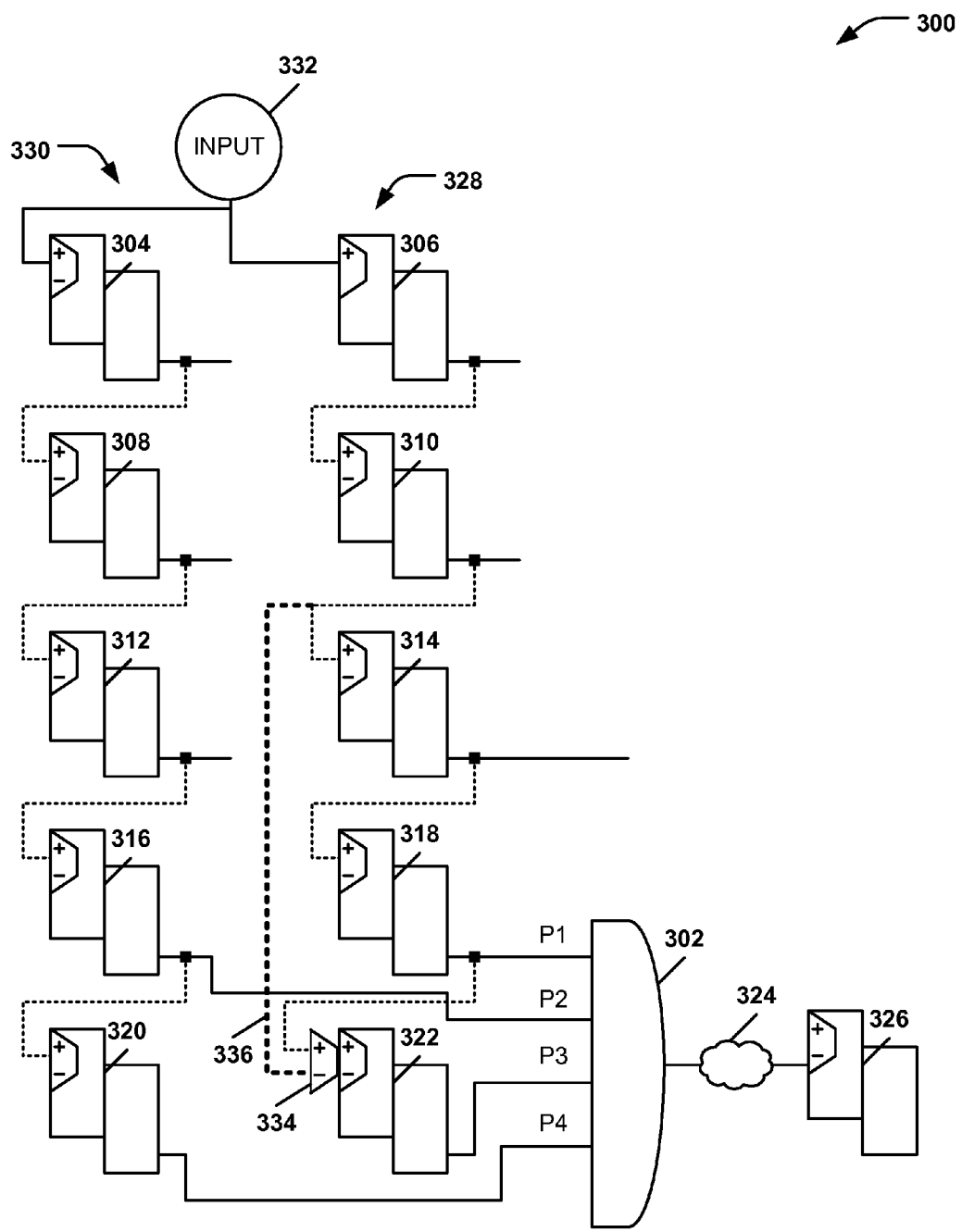
FIG. 3 shows a circuit configuration that includes a multiplexer inserted at a tap point to remove an adjacent scan dependency.

As shown in FIG. 3, an embodiment of a system 300 may analyze a cone of logic and identify a scan adjacent pair comprising a (top) latch 318 and a (bottom) latch 322. A cone of logic may include combination logic in a circuit that resolves to a single point. The circuit arrangement 300 is similar to the circuit arrangement 200 of FIG. 2 except it includes a multiplexer 334 inserted on a scan path 328 of the latch pair 318, 322.

The latch 322 may use data from the latch 318 during a launch on scan test. As such, the output of the latch 318 may affect what the latch 322 will filter down the scan path 328. This dependency may be avoided by pulling data from the latch 310.

The multiplexer 334 may be wired via a connection 336 to pull data from a non-adjacent latch 310. As a consequence, scan data of the latch 322 may no longer be dependent on latch 318. After the insertion of the multiplexer 334, a zero to one transition on P1 may not be blocked by P3. P3 may otherwise have been loaded with a zero and consequently interfered with the analysis of P1.

During the same analysis of a capture latch 326, another scan adjacent pair may be identified, a (top) latch 316 and a parallel (bottom) latch 320. As is shown in FIG. 3, the parallel chain may fed by the same scan input 332. Therefore, the dependency between the latch pair 318, 322 may be the same dependency as with latches 316 and 320. As such, the first pin P1 may be blocked by the fourth pin P4.

As is shown in FIG. 4, the dependency of the latch 420 may be fixed in the same manner as the latch 422 (and the latch 322 of FIG. 3). In a sense, the configuration of the latch 420 is a parallel copy of the configuration associated with the latch 422, including the associated dependency. To remove the dependency, a multiplexer 438 may pull data from the latch 408 as a new input to the latch 420 using a new connection 440. After the fix, a zero to one transition on the first pin P1 may no longer be blocked by the fourth pin P4. The fourth pin P4 may otherwise have blocked the first pin P1 by virtue of being loaded with a zero. As such, FIG. 4 shows a circuit configuration that includes a multiplexer 438 placed at a tap point to remove scan adjacency present across scan chains 428, 430 of the integrated circuit.

FIG. 5 shows another embodiment of a circuit configuration 500 that includes a multiplexer 542 configured to reduce dependencies, including identifying parallel position latch issues. The parallel position latch issues may be identified after all of scan latch adjacent pairs have been found. The circuit configuration 500 may be similar to the circuit configuration 400 of FIG. 4 with the addition of the multiplexer 542 and the associated connection 544 to address parallel latch dependency.

The latches 516, 518 may be the same distance away from the input 532. The latches 516, 518 may receive the same data at the same time and may thus exhibit a parallel path dependency. A transition on a first pin P1 of a four input AND gate 502 could be masked if there is a path delay fault on the latch 516, as both are transitioning at the same time. Similarly, a path delay fault on the latch 516 could be masked if the P1 path experiences a fault. The circuit configuration 500 of FIG. 5 may address this problem by including the multiplexer 542 on either the latch 516 or the latch 518. The inclusion may cause data to come from a different point in the scan chain, breaking the dependency and facilitating diagnostics.

Figure 6:
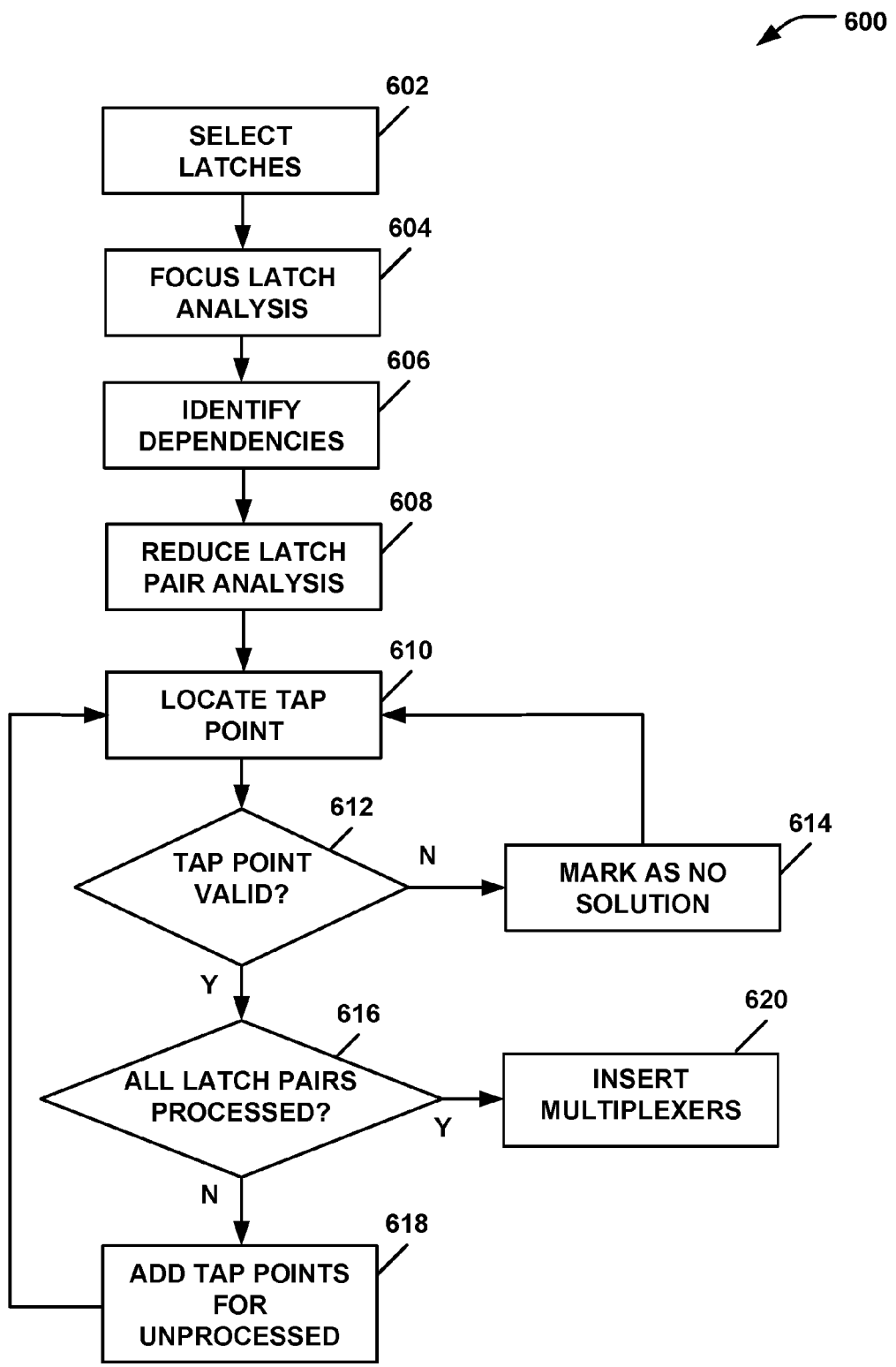
FIG. 6 is a flowchart of an embodiment of a method of positioning a multiplexer at a tap point to remove latch pair dependencies.

FIG. 6 is a flowchart illustrating an embodiment of a method 600 of diagnosing and reducing dependencies in a scan chain. The method may be performed by the system of FIG. 1 on the circuits of FIGS. 2-5. Turning more particularly to the flowchart in FIG. 6, latch pair dependencies may be identified and selected at 602 by analyzing latch endpoints. According to a particular embodiment, all latch dependencies may be initially selected. With reference to FIG. 5, latch dependencies may be selected as they potentially impact the latch 526 and cones of logic that feed the latches 504, 506, 508, 510, 512, 514, 516, 518, 520, 522.

The number of latch endpoints to be analyzed may be reduced and otherwise focused at 604 based on input from a designer. Illustrative designer input may indicate paths that should be included for functionality considerations. Other input to reduce latch endpoint analysis may include timing information used to exclude specified endpoints or paths. Such timing information may relate to a length of a path to be analyzed.

A cone of logic of each latch endpoint may be analyzed at 606 by identifying dependencies. For instance, the analysis may identify scan adjacency and common scan input parallel latch pairs. When a dependency is located, the dependency may be stored in a common endpoint matrix. An illustrative common endpoint matrix may include all contributing latches and a scan source for each latch.

According to a particular embodiment, a number of dependent latch pairs to be analyzed may be reduced at 608 based on several considerations. For example, analysis may be affected by whether there is sufficient timing slack on the top latch. Another consideration may relate to how much logic the pair feeds. Yet another example may pertain to whether an override of a bottom latch exists.

When a pair is selected at 610, a valid tap point may be located among a list of contributing latches in the common endpoint matrix. A valid tap point may comprise a scan position that does not contribute to a same cone of logic. The selection reduces a chance of selecting a scan position that unintentionally creates a new scan latch dependency. To assist in processing analysis, a valid tap point may be selected upstream in a scan chain. If multiple valid tap points are available, the tap point closest in position in the scan chain may be selected. This selection may limit the use of additional wiring When a valid tap point cannot be found at 612, the latch pair may be marked at 614 in memory as having no solution, and a next latch pair may be selected at 610 via located tap point. Marking a latch pair as such may avoid subsequent processing of a cone of logic involving the marked latch pair. When a valid tap point is located at 612, the system may determine at 616 whether there are additional latch pairs to be processed.

When the system determines at 616 that there are more latch pairs to process, tap points of contributing latches may be added at 618 to the common endpoint matrix. Updating the tap points may facilitate the common endpoint matrix being current for when the subsequent latch pairs are analyzed. If there are no more latch pairs to be processed at 616, multiplexers may be inserted at 620 on selected latches, modifying a scan input to come from a valid tap point.

Alternative solutions may be created by inserting a latch between an adjacent pair or by reordering to avoid pair adjacency. However such processes may add hardware used exclusively for testing, could invalidate previous fixes, and may require re-accomplishing dependency analysis.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A method of testing of an integrated circuit having latches, the method comprising:
   identifying scan adjacency latch pairs among the latches of the integrated circuit;
   for each identified scan adjacency latch pair, identifying a tap point among the latches such that the tap point is independent of a cone of logic corresponding to the identified scan adjacency latch pair;
   identifying a latch endpoint for a particular tap point of the integrated circuit;
   coupling a bypass structure to the latch endpoint and to the particular tap point; and
   testing the identified scan adjacency latch pair of the integrated circuit using the bypass structure.

2. The method of claim 1, wherein a first latch and a second latch are within the cone of logic of a component of the integrated circuit, wherein the cone of logic includes combination logic in the integrated circuit that resolves to a single point, and wherein the bypass structure enables testing of the component.

3. The method of claim 2, further comprising using an output of a second component of the integrated circuit as an input to the first latch, wherein the second component is not included within the cone of logic of the component.

4. The method of claim 1, wherein using the bypass structure includes a multiplexer.

5. The method of claim 1, further comprising, for the particular tap point, selecting a location of the particular tap point based on its proximity to one of the latches of the identified scan adjacency latch pairs.

6. The method of claim 1, further comprising storing a dependency relation among the latches of the identified scan adjacency latch pairs in a common endpoint matrix, wherein the dependency relation includes a scan source for each latch of the identified scan adjacency latch pairs.

7. The method of claim 6, further comprising determining not to add a multiplexer to address a particular scan adjacency latch pair of the scan adjacency latch pairs based on one of: timing information associated with the particular scan adjacency latch pair, timing slack associated with the particular scan adjacency latch pair, an output of the particular scan adjacency latch pair, or an override condition associated with the particular scan adjacency latch pair.

8. The method of claim 1, wherein a first latch and a second latch of a particular scan adjacency latch pair are within a scan chain of the integrated circuit.

9. The method of claim 1, wherein a first latch of a particular scan adjacency latch pair is located within a first scan chain of the integrated circuit, and wherein a second latch of the particular scan adjacency latch pair is located within a second scan chain of the integrated circuit.

10. The method of claim 1, further comprising selecting a location of the particular tap point to be upstream of a first latch of a particular scan adjacency latch pair.

11. A non-transitory computer readable storage medium comprising instructions that, when executed by a processor, cause the processor to:
   identify latches of an integrated circuit;
   identify one or more scan adjacency latch pairs among the identified latches;
   for a particular scan adjacency latch pair of the one or more scan adjacency latch pairs, identify a tap point among the identified latches such that the tap point is independent of a cone of logic corresponding to the particular scan adjacency latch pair within the integrated circuit;
   identify an endpoint for the tap point;
   identify a location at a component within the integrated circuit for bypass structure based on the tap point, the endpoint, or both; and
   test the particular scan adjacency latch pair using the bypass structure that is coupled to the tap point and to the endpoint.

12. The non-transitory computer readable storage medium of claim 11, wherein a first latch and a second latch are within the cone of logic of a component of the integrated circuit, wherein the cone of logic includes combination logic of the integrated circuit that resolves to a single point, and wherein the bypass structure enables testing of the component.

13. The non-transitory computer readable storage medium of claim 12, wherein the instructions further cause the processor to use an output of a second component of the integrated circuit as an input to the first latch, and wherein the second component is independent of the cone of logic of the component.

14. The non-transitory computer readable storage medium of claim 11, wherein the bypass structure includes a multiplexer.

15. The non-transitory computer readable storage medium of claim 11, wherein the instructions further cause the processor to select a tap point location of the tap point based on a proximity to one of the latches of the particular scan adjacency latch pair.

16. The non-transitory computer readable storage medium of claim 11, wherein the instructions further cause the processor to store, in a common endpoint matrix, a dependency relation among the latches of the one or more scan adjacency latch pairs, and wherein the dependency relation includes a scan source for each latch of the one or more scan adjacency latch pairs.

17. The non-transitory computer readable storage medium of claim 16, wherein the instructions further cause the processor to determine not to add a second bypass structure to address a second scan adjacency latch pair of the one or more scan adjacency latch pairs based on one of: timing information associated with the second scan adjacency latch pair, timing slack associated with the second scan adjacency latch pair, an output of the second scan adjacency latch pair, or an override condition associated with the second scan adjacency latch pair.

18. The non-transitory computer readable storage medium of claim 11, wherein a first latch and a second latch of the particular scan adjacency latch pair are within a scan chain of the integrated circuit.

19. The non-transitory computer readable storage medium of claim 11, wherein a first latch of a second scan adjacency latch pair is located within a first scan chain of the integrated circuit, and wherein a second latch of the second scan adjacency latch pair is located within a second scan chain of the integrated circuit.

20. The non-transitory computer readable storage medium of claim 11, wherein the instructions further cause the processor to select a tap point location of the tap point to be upstream of a first latch of the particular scan adjacency latch pair.

\* \* \* \* \*